US011735467B2

(12) United States Patent
Pal et al.

(10) Patent No.: US 11,735,467 B2
(45) Date of Patent: Aug. 22, 2023

(54) AIRGAP FORMATION PROCESSES

(71) Applicant: Applied Materials, Inc., Santa Clara, CA (US)

(72) Inventors: Ashish Pal, Hayward, CA (US); Gaurav Thareja, Santa Clara, CA (US); Sankuei Lin, Los Gatos, CA (US); Ching-Mei Hsu, Mountain View, CA (US); Nitin K. Ingle, San Jose, CA (US); Ajay Bhatnagar, Saratoga, CA (US); Anchuan Wang, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 17/558,848

(22) Filed: Dec. 22, 2021

(65) Prior Publication Data
US 2022/0115263 A1   Apr. 14, 2022

Related U.S. Application Data

(62) Division of application No. 16/277,104, filed on Feb. 15, 2019, now Pat. No. 11,211,286.

(Continued)

(51) Int. Cl.
*H01L 21/764* (2006.01)
*H01L 21/8238* (2006.01)
(Continued)

(52) U.S. Cl.
CPC .... *H01L 21/764* (2013.01); *H01L 21/823814* (2013.01); *H01L 21/823821* (2013.01);
(Continued)

(58) Field of Classification Search
CPC .......... H01L 21/764; H01L 21/823814; H01L 21/823821; H01L 21/823864;
(Continued)

(56) References Cited

U.S. PATENT DOCUMENTS 9,716,158 B1   7/2017  Cheng et al.
9,768,118 B1   9/2017  Li et al.
(Continued)

FOREIGN PATENT DOCUMENTS

CN      105047715 A    11/2015
JP      2011181931 A    9/2011
(Continued)

OTHER PUBLICATIONS

International Preliminary Report on Patentability dated Aug. 18, 2020 in International Patent Application No. PCT/US2019/018301, all pages.
(Continued)

*Primary Examiner* — Timor Karimy
(74) *Attorney, Agent, or Firm* — Kilpatrick Townsend & Stockton LLP

(57) ABSTRACT

Processing methods may be performed to form an airgap spacer on a semiconductor substrate. The methods may include forming a spacer structure including a first material and a second material different from the first material. The methods may include forming a source/drain structure. The source/drain structure may be offset from the second material of the spacer structure by at least one other material. The methods may also include etching the second material from the spacer structure to form the airgap. The source/drain structure may be unexposed to etchant materials during the etching.

3 Claims, 8 Drawing Sheets

Related U.S. Application Data

(60) Provisional application No. 62/631,179, filed on Feb. 15, 2018.

(51) Int. Cl.
  | | |
  |---|---|
  | *H01L 29/06* | (2006.01) |
  | *H01L 29/66* | (2006.01) |
  | *H01L 29/78* | (2006.01) |
  | *H01L 27/092* | (2006.01) |
  | *H01L 29/417* | (2006.01) |

(52) U.S. Cl.
  CPC ............ *H01L 21/823864* (2013.01); *H01L 21/823878* (2013.01); *H01L 27/0924* (2013.01); *H01L 29/0649* (2013.01); *H01L 29/6656* (2013.01); *H01L 29/66795* (2013.01); *H01L 29/785* (2013.01); *H01L 29/7851* (2013.01); *H01L 29/41791* (2013.01)

(58) Field of Classification Search
  CPC ......... H01L 21/823878; H01L 27/0924; H01L 29/0649; H01L 29/6656; H01L 29/66795; H01L 29/785; H01L 29/7851; H01L 29/41791
  See application file for complete search history.

(56) References Cited

U.S. PATENT DOCUMENTS

| | | |
|---|---|---|
| 11,211,286 B2 | 12/2021 | Pal et al. |
| 2015/0263122 A1* | 9/2015 | Hsiao .................... H01L 29/518 |
| | | 438/283 |
| 2016/0163816 A1 | 6/2016 | Yu et al. |
| 2016/0225667 A1 | 8/2016 | Zang |
| 2018/0158818 A1 | 6/2018 | Bergendahl et al. |
| 2019/0172752 A1* | 6/2019 | Hsu .................. H01L 21/31144 |

FOREIGN PATENT DOCUMENTS

| | | |
|---|---|---|
| JP | 2017-512383 A | 5/2017 |
| KR | 10-0868649 B1 | 11/2008 |
| KR | 2013-0106622 A | 9/2013 |
| KR | 2014-0123639 A | 10/2014 |
| KR | 2015-0081738 A | 7/2015 |
| KR | 2017-0122930 A | 11/2017 |

OTHER PUBLICATIONS

International Search Report and Written Opinion dated Jun. 14, 2019 in International Patent Application No. PCT/US2019/018301, all pages.

\* cited by examiner

AIRGAP FORMATION PROCESSES

CROSS-REFERENCE TO RELATED APPLICATIONS

This application is a divisional of U.S. Non-Provisional application Ser. No. 16/277,104, filed Feb. 15, 2019, which claims the benefit of U.S. Provisional Application No. 62/631,179, filed Feb. 15, 2018, both of which are hereby incorporated by reference in their entirety for all purposes.

TECHNICAL FIELD

The present technology relates to semiconductor systems, processes, and equipment. More specifically, the present technology relates to systems and methods for forming and etching material layers on a semiconductor device.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process or individual material removal. Such an etch process is said to be selective to the first material. As a result of the diversity of materials, circuits, and processes, etch processes have been developed with a selectivity towards a variety of materials.

Etch processes may be termed wet or dry based on the materials used in the process. A wet HF etch preferentially removes silicon oxide over other dielectrics and materials. However, wet processes may have difficulty penetrating some constrained trenches and also may sometimes deform the remaining material. Dry etch processes may penetrate into intricate features and trenches, but may not provide acceptable top-to-bottom profiles. As device sizes continue to shrink in next-generation devices, selectivity may play a larger role when only a few nanometers of material are formed in a particular layer, especially when the material is critical in the transistor formation. Moreover, as the number of exposed materials increases at any given time during fabrication, it is becoming more difficult to maintain sufficient selectivity to all other exposed materials. Many different etch process selectivities have been developed between various materials, although standard selectivities may no longer be suitable at current and future device scale.

Thus, there is a need for improved systems and methods that can be used to produce high quality devices and structures. These and other needs are addressed by the present technology.

SUMMARY

Processing methods may be performed to form an airgap spacer on a semiconductor substrate. The methods may include forming a spacer structure including a first material and a second material different from the first material. The methods may include forming a source/drain structure. The source/drain structure may be offset from the second material of the spacer structure by at least one other material. The methods may also include etching the second material from the spacer structure to form the airgap. The source/drain structure may be unexposed to etchant materials during the etching.

In some embodiments the spacer structure may be formed proximate a gate structure on a semiconductor substrate. The source/drain structure may be formed normal to the gate structure. The source/drain structure may be or include silicon or silicon germanium. The first material and second material may be or include oxygen or nitrogen. The first material and second material may be or include one or more of silicon nitride, silicon carbonitride, silicon oxycarbide, silicon oxycarbonitride, silicon oxide, a metal oxide, or a metal nitride. Forming the spacer structure may include forming a first spacer layer including the first material adjacent a gate structure. The first spacer layer may at least partially cover fins intersecting the gate structure. Forming the spacer structure may also include forming a second spacer layer including the second material adjacent the first spacer layer. The methods may also include forming a third spacer layer adjacent the second spacer layer. The third spacer layer may be the same material as the first spacer layer. The methods may also include, prior to forming the third spacer layer, etching the first spacer layer and the second spacer layer to expose the fins intersecting the gate structure. The methods may also include etching the third spacer layer to partially expose the fins intersecting the gate structure.

The present technology also encompasses semiconductor structures including a substrate and a gate structure overlying the substrate and formed in a first direction across the substrate. The structures may include a fin overlying the substrate and formed in a second direction across the substrate. The second direction may be normal to the first direction, and the fin may intersect the gate structure. The structures may include a spacer structure adjacent the gate structure. The spacer structure may include at least three layers including an airgap. The structures may also include a source/drain material formed about the fin external to the spacer structure. At least one intervening layer of the spacer structure may be included between the source/drain material and the airgap.

In some embodiments the spacer structure may include a first layer adjacent the gate structure and extending a first distance laterally outward from the gate structure over the fin and the substrate. The spacer structure may also include a second layer laterally outward from the first layer and contacting the first layer at the first distance. The airgap may be at least partially defined between a portion of the first layer adjacent the gate, a portion of the first layer overlying the substrate, and the second layer. The first layer and second layer may be or include one or more materials selected from the group consisting of silicon nitride, silicon carbonitride, silicon oxycarbide, silicon oxycarbonitride, silicon oxide, a metal oxide, and a metal nitride. The structures may also include a contact etch stop layer positioned laterally outward of the spacer structure in a direction from the gate structure.

The present technology may also encompass methods of forming a semiconductor structure. The methods may include forming a first spacer layer proximate a gate structure on a semiconductor substrate. The first spacer layer may at least partially overlie a fin formed on the semiconductor substrate. The methods may include forming a second spacer layer adjacent the first spacer layer. The methods may include recessing the first spacer layer and the second spacer layer to fully vertically expose lateral regions the fin. The methods may include forming a third spacer layer adjacent the first spacer layer. The third spacer layer may at least partially overlie the fin formed on the semiconductor substrate. The methods may also include recessing the third spacer layer to partially vertically expose the lateral regions of the fin. The methods may also include epitaxially growing source/drain material on the partially vertically exposed regions of the fin. The methods may include etching the second spacer layer selective to the first spacer layer and the third spacer layer to form an airgap between the first spacer layer and the third spacer layer. In some embodiments the source/drain material may not be exposed to etchant materials during the etching.

Such technology may provide numerous benefits over conventional systems and techniques. For example, by maintaining an intervening layer between the airgap and the source/drain material, the source/drain material may not be exposed to any etchant materials during the airgap formation. Additionally, because the source/drain material may not be exposed to the etchant, less selective or non-selective etchants with respect to the source/drain material may be used. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
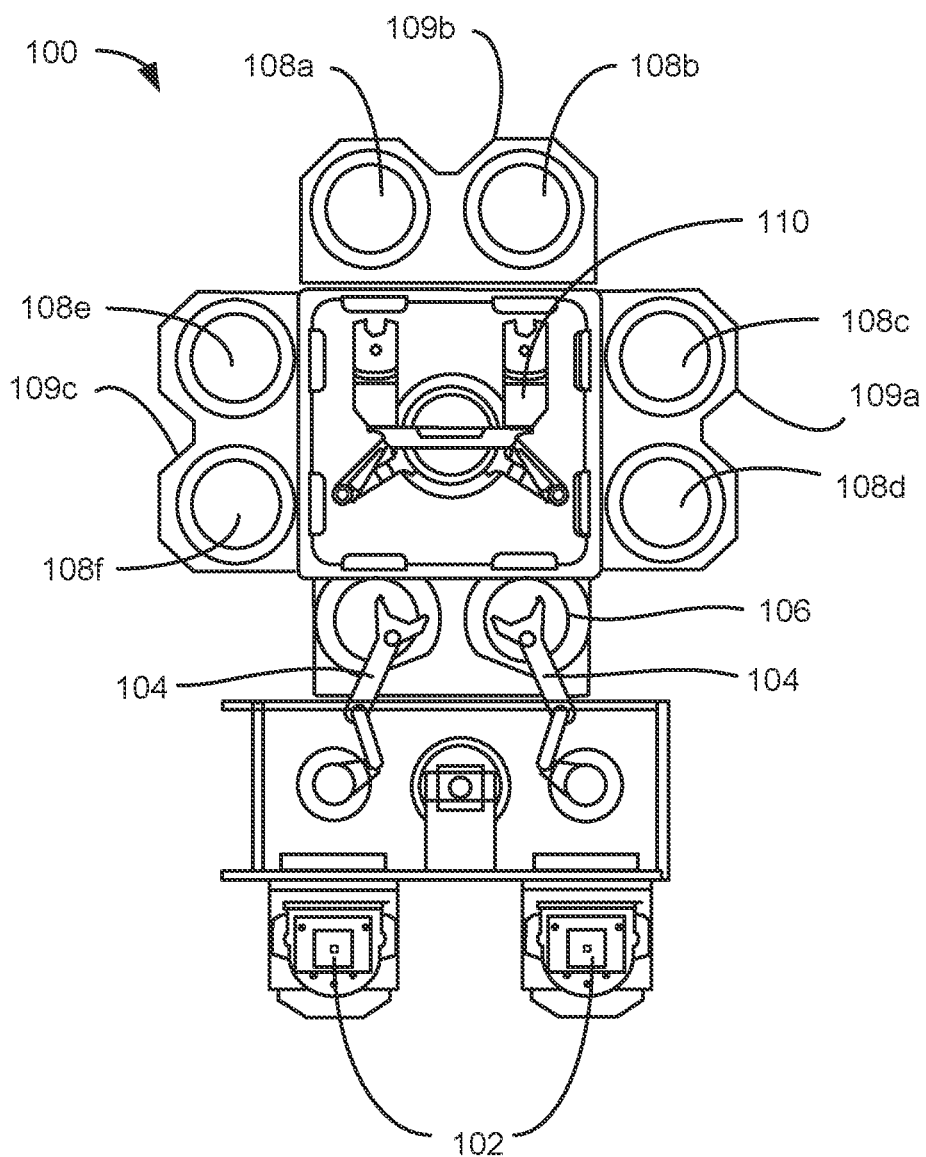
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

The present technology includes systems and components for semiconductor processing of small pitch features. As device sizes continue to shrink, parasitic capacitance becomes a greater issue. Specifically, two types of capacitance in semiconductor devices are active capacitance and parasitic capacitance. Active capacitance generally relates to standard device performance. Parasitic capacitance tends to detrimentally affect device performance, and often occurs when parallel conductive lines are separated by dielectric. For example, in a transistor structures, the source and drain may be connected to a vertical conductive wire, and the gate may be connected with a vertical conductive wire as well. These conductive wires may be two metal wires that are running parallel to one another and are separated by a dielectric material, such as an oxide. This structure may cause a parasitic capacitance across the dielectric, which is unwanted. This capacitance may essentially slow device performance by causing delays, which reduces the frequency of the device, and also contributes to power consumption.

Parasitic capacitance depends on the dielectric constant of the intervening material as well as the spacing between the parallel wires. As device features shrink in size, less and less dielectric is positioned between the wires, which may increase parasitic capacitance. Common dielectric materials include silicon oxide, which may be characterized by a dielectric constant of around 4-5 depending on the oxide. This dielectric constant may be insufficient to overcome the reduced spacing between parallel conductive lines. Accordingly, alternative materials may be used. Air may be characterized by a dielectric constant of about 1, and thus incorporating an air gap within an oxide may reduce the overall dielectric constant between the conductive wires, which may reduce parasitic capacitance.

Conventional technologies have struggled with airgap formation because the etch process requires increased complexity and exposure of surrounding materials. For example, to create a vertical channel for the airgap, alternative materials may be required in the dielectric to allow a selectivity between the two materials such that the sacrificial material can be removed to form the airgap, while the spacer material may be maintained. Because multiple dielectrics are utilized in fabrication, when manufacturing reaches the stage to form the airgap, multiple other dielectric materials may be exposed, which may each be characterized by a selectivity with respect to the sacrificial material. Moreover, airgap formation may occur subsequent source/drain material formation, such as epitaxial growth of silicon or silicon germanium structures, which may later form the source and drain across the gate structure. When the airgap is formed, the source/drain material may also be exposed to the etchant material. Although a particular selectivity may exist between the sacrificial material and the source/drain material, this selectivity may still cause an amount of etching of the source/drain material to occur, which may detrimentally affect device performance.

The present technology overcomes these issues with several adjustments to the process for removal and formation, and by utilizing an improved spacer structure. Spacers according to the present technology may include multiple spacer layers and a fabrication process that may remove exposure of source/drain material to etchants during airgap formation. By utilizing a multiple spacer structure formed according to the present technology, a consistent airgap may be produced to reduce parasitic capacitance without the conventional detrimental effect of etching source/drain materials.

Although the remaining disclosure will routinely identify specific etching processes utilizing the disclosed technology, it will be readily understood that the systems and methods are equally applicable to deposition and cleaning processes as may occur in the described chambers. Accordingly, the technology should not be considered to be so limited as for use with etching processes alone. The disclosure will discuss one possible system and chamber that can be used with the present technology to perform certain of the removal operations before describing operations of an exemplary process sequence according to the present technology.

FIG. 1 shows a top plan view of one embodiment of a processing system 100 of deposition, etching, baking, and curing chambers according to embodiments. In the figure, a pair of front opening unified pods (FOUPs) 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation, and other substrate processes.

The substrate processing chambers 108a-f may include one or more system components for depositing, annealing, curing and/or etching a dielectric film on the substrate wafer. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to etch a dielectric film on the substrate. Any one or more of the processes described may be carried out in chamber(s) separated from the fabrication system shown in different embodiments. It will be appreciated that additional configurations of deposition, etching, annealing, and curing chambers for dielectric films are contemplated by system 100.

Figure 2A:
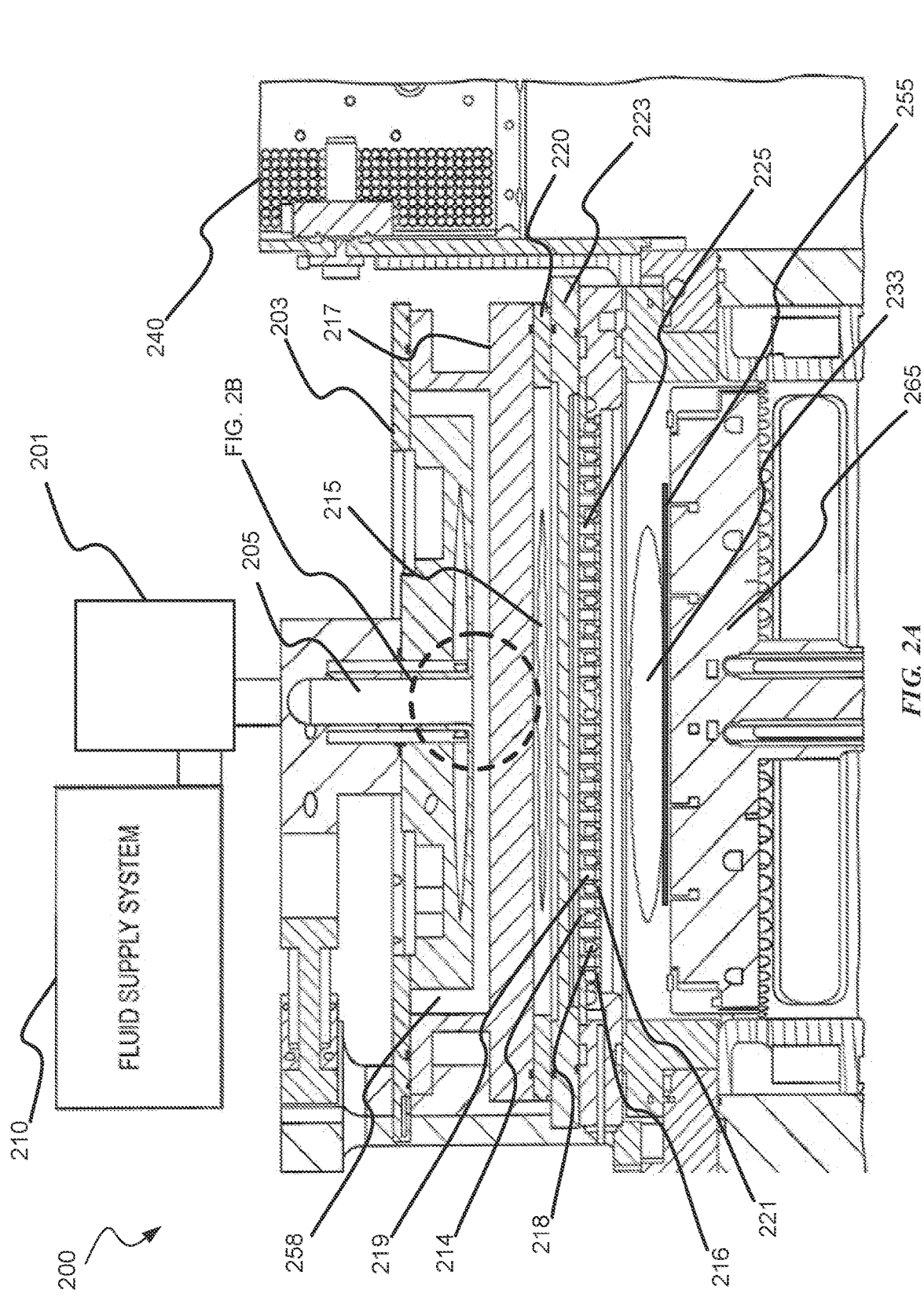
FIG. 2A shows a schematic cross-sectional view of an exemplary processing chamber according to some embodiments of the present technology.

FIG. 2A shows a cross-sectional view of an exemplary process chamber system 200 with partitioned plasma generation regions within the processing chamber. During film etching, e.g., titanium nitride, tantalum nitride, tungsten, silicon, polysilicon, silicon oxide, silicon nitride, silicon oxynitride, silicon oxycarbide, etc., a process gas may be flowed into the first plasma region 215 through a gas inlet assembly 205. A remote plasma system (RPS) 201 may optionally be included in the system, and may process a first gas which then travels through gas inlet assembly 205. The inlet assembly 205 may include two or more distinct gas supply channels where the second channel (not shown) may bypass the RPS 201, if included.

A cooling plate 203, faceplate 217, ion suppressor 223, showerhead 225, and a substrate support 265, having a substrate 255 disposed thereon, are shown and may each be included according to embodiments. The pedestal 265 may have a heat exchange channel through which a heat exchange fluid flows to control the temperature of the substrate, which may be operated to heat and/or cool the substrate or wafer during processing operations. The wafer support platter of the pedestal 265, which may comprise aluminum, ceramic, or a combination thereof, may also be resistively heated in order to achieve relatively high temperatures, such as from up to or about 100° C. to above or about 1100° C., using an embedded resistive heater element.

The faceplate 217 may be pyramidal, conical, or of another similar structure with a narrow top portion expanding to a wide bottom portion. The faceplate 217 may additionally be flat as shown and include a plurality of through-channels used to distribute process gases. Plasma generating gases and/or plasma excited species, depending on use of the RPS 201, may pass through a plurality of holes, shown in FIG. 2B, in faceplate 217 for a more uniform delivery into the first plasma region 215.

Exemplary configurations may include having the gas inlet assembly 205 open into a gas supply region 258 partitioned from the first plasma region 215 by faceplate 217 so that the gases/species flow through the holes in the faceplate 217 into the first plasma region 215. Structural and operational features may be selected to prevent significant backflow of plasma from the first plasma region 215 back into the supply region 258, gas inlet assembly 205, and fluid supply system 210. The faceplate 217, or a conductive top portion of the chamber, and showerhead 225 are shown with an insulating ring 220 located between the features, which allows an AC potential to be applied to the faceplate 217 relative to showerhead 225 and/or ion suppressor 223. The insulating ring 220 may be positioned between the faceplate 217 and the showerhead 225 and/or ion suppressor 223 enabling a capacitively coupled plasma (CCP) to be formed in the first plasma region. A baffle (not shown) may additionally be located in the first plasma region 215, or otherwise coupled with gas inlet assembly 205, to affect the flow of fluid into the region through gas inlet assembly 205.

The ion suppressor 223 may comprise a plate or other geometry that defines a plurality of apertures throughout the structure that are configured to suppress the migration of ionically-charged species out of the first plasma region 215 while allowing uncharged neutral or radical species to pass through the ion suppressor 223 into an activated gas delivery region between the suppressor and the showerhead. In embodiments, the ion suppressor 223 may comprise a perforated plate with a variety of aperture configurations. These uncharged species may include highly reactive species that are transported with less reactive carrier gas through the apertures. As noted above, the migration of ionic species through the holes may be reduced, and in some instances completely suppressed. Controlling the amount of ionic species passing through the ion suppressor 223 may advantageously provide increased control over the gas mixture brought into contact with the underlying wafer substrate, which in turn may increase control of the deposition and/or etch characteristics of the gas mixture. For example, adjustments in the ion concentration of the gas mixture can significantly alter its etch selectivity, e.g., SiNx:SiOx etch ratios, Si:SiOx etch ratios, etc. In alternative embodiments in which deposition is performed, it can also shift the balance of conformal-to-flowable style depositions for dielectric materials.

The plurality of apertures in the ion suppressor 223 may be configured to control the passage of the activated gas, i.e., the ionic, radical, and/or neutral species, through the ion suppressor 223. For example, the aspect ratio of the holes, or the hole diameter to length, and/or the geometry of the holes may be controlled so that the flow of ionically-charged species in the activated gas passing through the ion suppressor 223 is reduced. The holes in the ion suppressor 223 may include a tapered portion that faces the plasma excitation region 215, and a cylindrical portion that faces the showerhead 225. The cylindrical portion may be shaped and dimensioned to control the flow of ionic species passing to the showerhead 225. An adjustable electrical bias may also be applied to the ion suppressor 223 as an additional means to control the flow of ionic species through the suppressor.

The ion suppressor 223 may function to reduce or eliminate the amount of ionically charged species traveling from the plasma generation region to the substrate. Uncharged neutral and radical species may still pass through the openings in the ion suppressor to react with the substrate. It should be noted that the complete elimination of ionically charged species in the reaction region surrounding the substrate may not be performed in embodiments. In certain instances, ionic species are intended to reach the substrate in order to perform the etch and/or deposition process. In these instances, the ion suppressor may help to control the concentration of ionic species in the reaction region at a level that assists the process.

Showerhead 225 in combination with ion suppressor 223 may allow a plasma present in first plasma region 215 to avoid directly exciting gases in substrate processing region 233, while still allowing excited species to travel from chamber plasma region 215 into substrate processing region 233. In this way, the chamber may be configured to prevent the plasma from contacting a substrate 255 being etched. This may advantageously protect a variety of intricate structures and films patterned on the substrate, which may be damaged, dislocated, or otherwise warped if directly contacted by a generated plasma. Additionally, when plasma is allowed to contact the substrate or approach the substrate level, the rate at which oxide species etch may increase. Accordingly, if an exposed region of material is oxide, this material may be further protected by maintaining the plasma remotely from the substrate.

The processing system may further include a power supply 240 electrically coupled with the processing chamber to provide electric power to the faceplate 217, ion suppressor 223, showerhead 225, and/or pedestal 265 to generate a plasma in the first plasma region 215 or processing region 233. The power supply may be configured to deliver an adjustable amount of power to the chamber depending on the process performed. Such a configuration may allow for a tunable plasma to be used in the processes being performed. Unlike a remote plasma unit, which is often presented with on or off functionality, a tunable plasma may be configured to deliver a specific amount of power to the plasma region 215. This in turn may allow development of particular plasma characteristics such that precursors may be dissociated in specific ways to enhance the etching profiles produced by these precursors.

A plasma may be ignited either in chamber plasma region 215 above showerhead 225 or substrate processing region 233 below showerhead 225. In embodiments, the plasma formed in substrate processing region 233 may be a DC biased plasma formed with the pedestal acting as an electrode. Plasma may be present in chamber plasma region 215 to produce the radical precursors from an inflow of, for example, a fluorine-containing precursor or other precursor.

An AC voltage typically in the radio frequency (RF) range may be applied between the conductive top portion of the processing chamber, such as faceplate 217, and showerhead 225 and/or ion suppressor 223 to ignite a plasma in chamber plasma region 215 during deposition. An RF power supply may generate a high RF frequency of 13.56 MHz but may also generate other frequencies alone or in combination with the 13.56 MHz frequency.

Figure 2B:
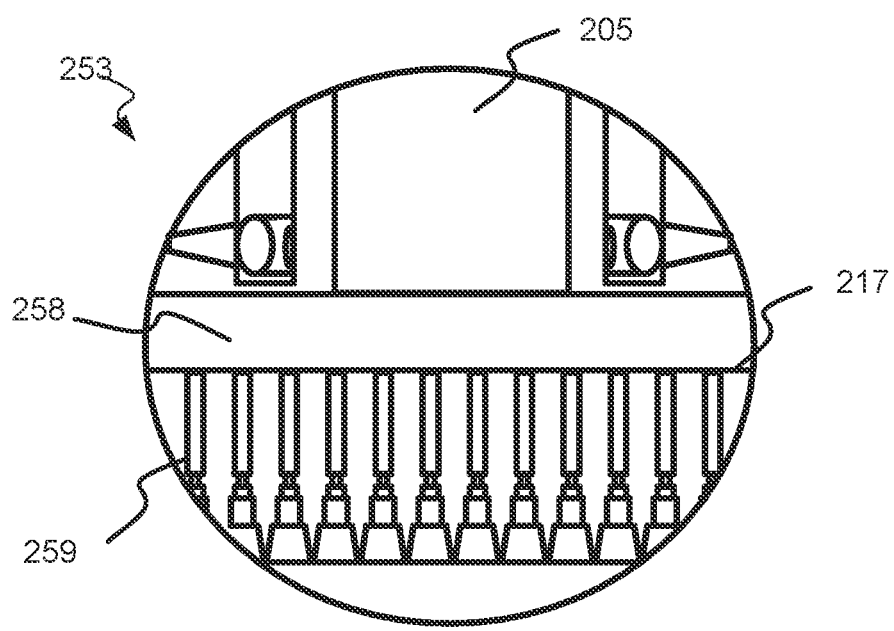
FIG. 2B shows a detailed view of an exemplary showerhead according to some embodiments of the present technology.

FIG. 2B shows a detailed view 253 of the features affecting the processing gas distribution through faceplate 217. As shown in FIGS. 2A and 2B, faceplate 217, cooling plate 203, and gas inlet assembly 205 intersect to define a gas supply region 258 into which process gases may be delivered from gas inlet 205. The gases may fill the gas supply region 258 and flow to first plasma region 215 through apertures 259 in faceplate 217. The apertures 259 may be configured to direct flow in a substantially unidirectional manner such that process gases may flow into processing region 233, but may be partially or fully prevented from backflow into the gas supply region 258 after traversing the faceplate 217.

Figure 3:
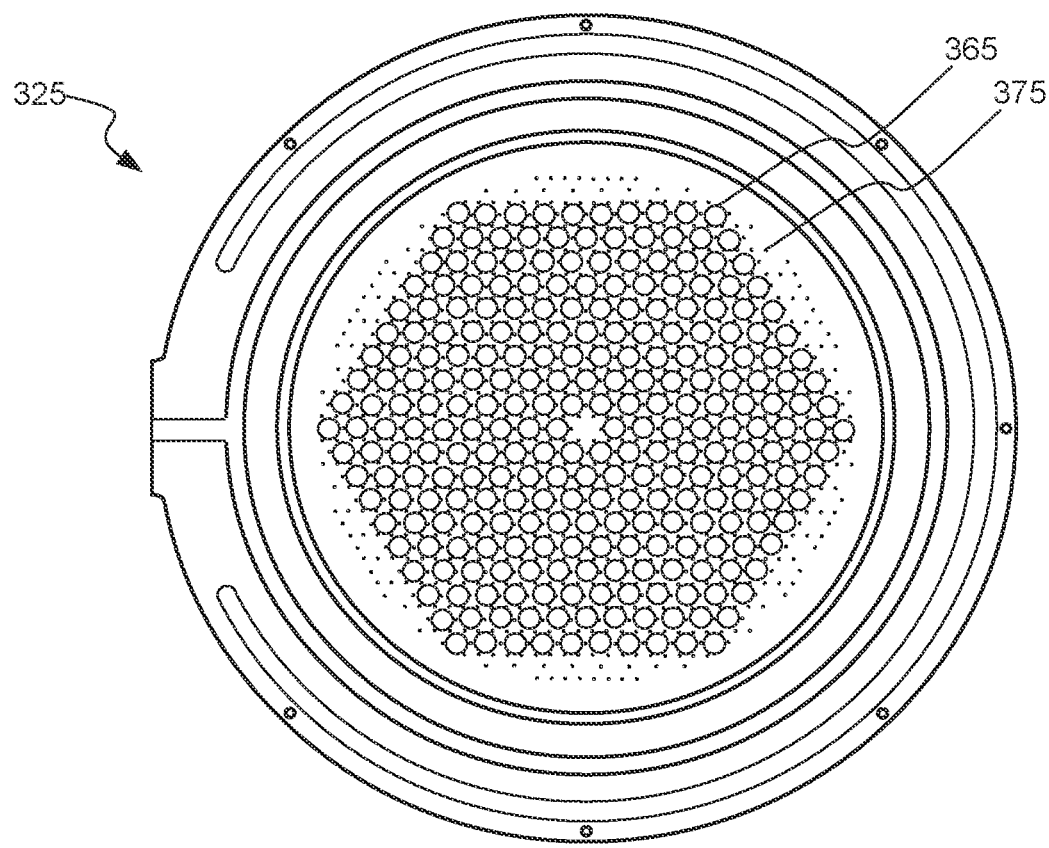
FIG. 3 shows a bottom plan view of an exemplary showerhead according to some embodiments of the present technology.

The gas distribution assemblies such as showerhead 225 for use in the processing chamber section 200 may be referred to as dual channel showerheads (DCSH) and are additionally detailed in the embodiments described in FIG. 3. The dual channel showerhead may provide for etching processes that allow for separation of etchants outside of the processing region 233 to provide limited interaction with chamber components and each other prior to being delivered into the processing region.

The showerhead 225 may comprise an upper plate 214 and a lower plate 216. The plates may be coupled with one another to define a volume 218 between the plates. The coupling of the plates may be so as to provide first fluid channels 219 through the upper and lower plates, and second fluid channels 221 through the lower plate 216. The formed channels may be configured to provide fluid access from the volume 218 through the lower plate 216 via second fluid channels 221 alone, and the first fluid channels 219 may be fluidly isolated from the volume 218 between the plates and the second fluid channels 221. The volume 218 may be fluidly accessible through a side of the gas distribution assembly 225.

FIG. 3 is a bottom view of a showerhead 325 for use with a processing chamber according to embodiments. Showerhead 325 may correspond with the showerhead 225 shown in FIG. 2A. Through-holes 365, which show a view of first fluid channels 219, may have a plurality of shapes and configurations in order to control and affect the flow of precursors through the showerhead 225. Small holes 375, which show a view of second fluid channels 221, may be distributed substantially evenly over the surface of the showerhead, even amongst the through-holes 365, and may help to provide more even mixing of the precursors as they exit the showerhead than other configurations.

Figure 4:
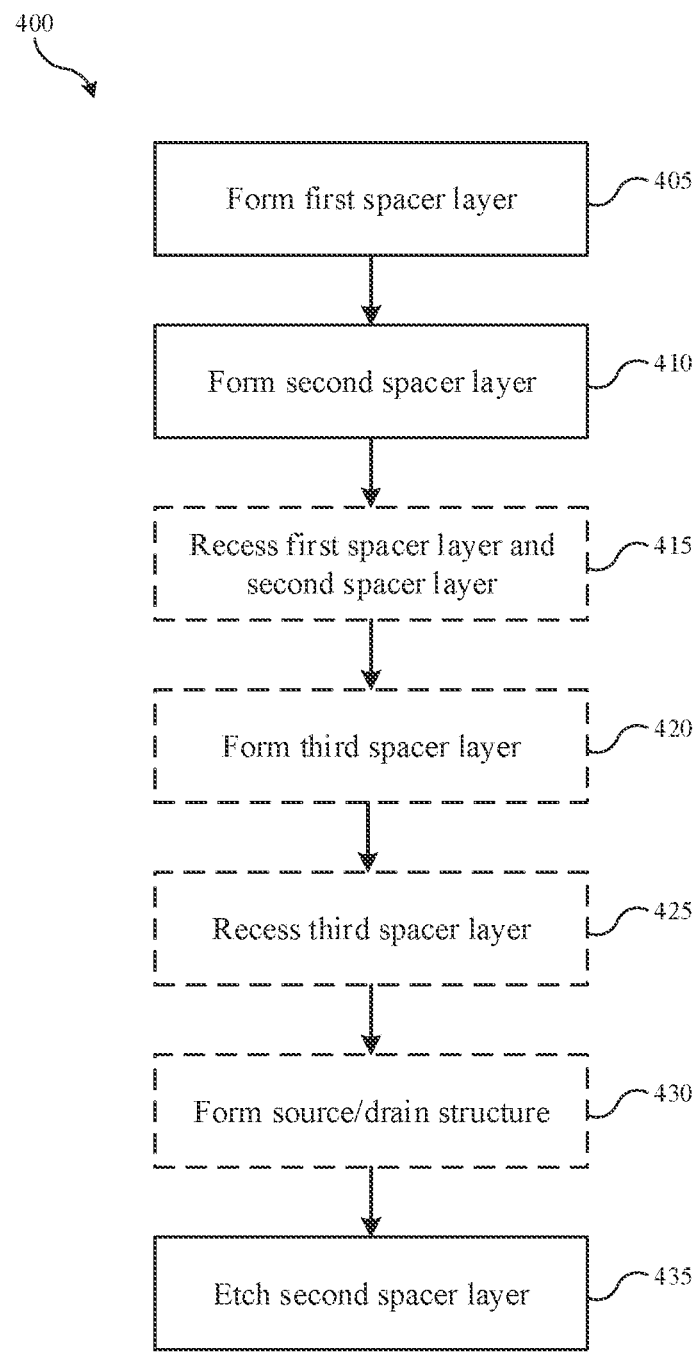
FIG. 4 shows selected operations in a method of forming an airgap in a semiconductor structure according to some embodiments of the present technology.

FIG. 4 illustrates selected operations of a fabrication method 400, many operations of which may be performed, for example, in the chamber 200 as previously described. Method 400 may include one or more operations prior to the initiation of the method, including front end processing, deposition, etching, polishing, cleaning, or any other operations that may be performed prior to the described operations. The method may include a number of optional operations as denoted in the figure, which may or may not be specifically associated with some embodiments of methods according to the present technology. For example, many of the operations are described in order to provide a broader scope of the structural formation, but are not critical to the technology, or may be performed by alternative methodology as will be discussed further below. Method 400 describes operations shown schematically in FIG. 5, the illustrations of which will be described in conjunction with the operations of method 400. It is to be understood that FIG. 5 illustrates only partial schematic views, and a substrate may contain any number of transistor sections having aspects as illustrated in the figures, as well as alternative structural aspects that may still benefit from aspects of the present technology.

Figure 5A:
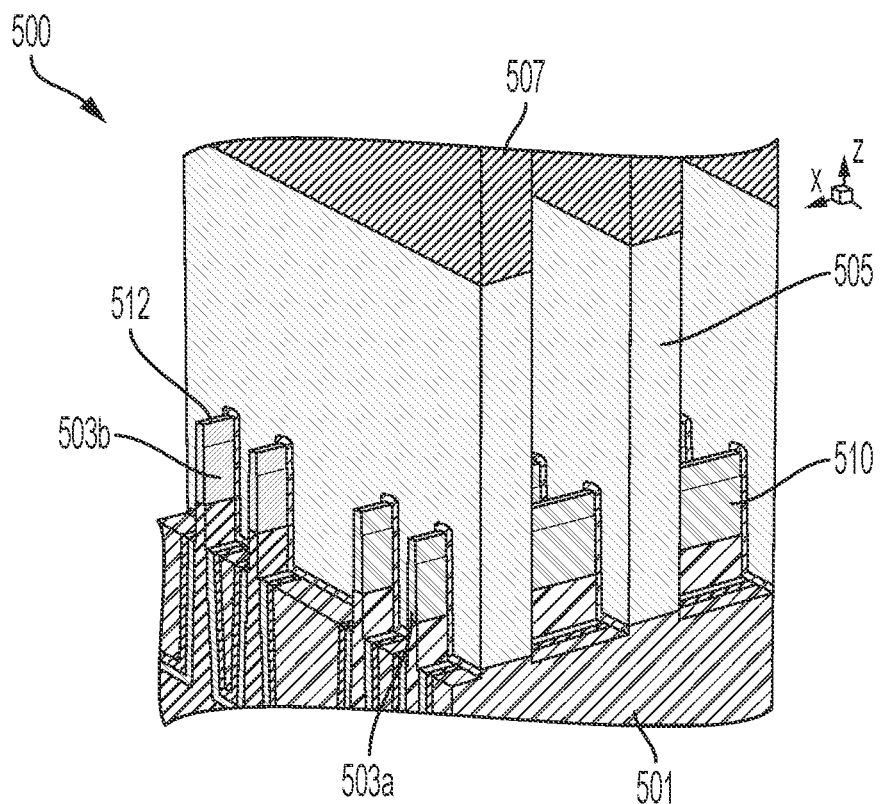
FIGS. 5A-5H illustrate schematic perspective views of substrate materials on which selected operations are being performed according to some embodiments of the present technology.

Method 400 may involve optional operations to develop the semiconductor structure to a particular fabrication operation. As illustrated in FIG. 5A, the semiconductor structure may represent a device after a dummy gate material has been etched about fin materials, such as in the P and N regions of the substrate. As illustrated, structure 500 may include a substrate 501 made of or containing silicon or some other semiconductor substrate material, on which one or more fin materials 503 has been formed across the substrate 501. Structure 500 may have a number of transistor structures formed overlaying the substrate 501. For example, a gate structure 505, which may be a dummy gate material, may be formed over the substrate 501, which may be removed later in processing to produce a metal gate. Gate structure 505 may have a cap material 507 formed overlying the dummy gate. As illustrated, gate structures 505 may be formed overlying the substrate in a first direction across the substrate. Additionally, fins 503 may be formed in a second direction across the substrate. The second direction may be normal to the first direction, and the fins 503 may specifically intersect and cross through the gate structures 505.

In some embodiments, the dummy gate may be polysilicon or a silicon-containing material. Cap material 507 may be a dielectric material, and for example, may be silicon nitride. As illustrated, structure 500 includes an N-MOS region 510 and a P-MOS region 512, although the orientation may not be important during the processing and the structure may illustrate the reverse regions. Several of the operations discussed below may be performed on one side of the structure while the other side remains masked, although not illustrated. The masking may then be switched with a removal and re-formation, and then similar operations may be performed on the other structure. These options will be described further below, although it is to be understood that either region may be processed before the other, and the methods are not limited by the examples described. Additionally, the spacer materials to be discussed below may be formed simultaneously over the substrate prior to any masking for later formation. Fins 503 may include the same or different materials in different embodiments and may be any known materials including silicon or silicon germanium in some embodiments. For example, in P-region 512, fins 503a may be or include silicon, and in N-region 510, fins 503b may be or include silicon germanium.

Figure 5B:
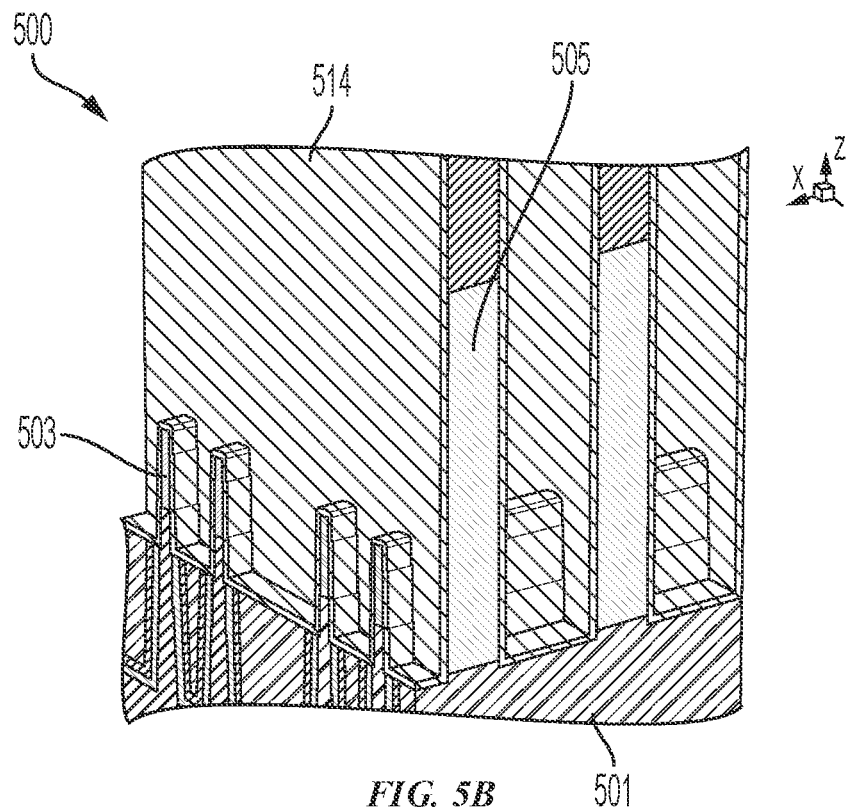

At operation 405, a first spacer layer 514 may be formed over the exposed structures as illustrated in FIG. 5B. As illustrated, first spacer layer 514 may at least partially cover gate structures 505, fins 503, as well as exposed surfaces on substrate 501. The first spacer layer 514 may be formed to conformally cover the exposed materials. First spacer layer 514 may be proximate each of these exposed structures, and may be directly adjacent gate structure 505 along the sidewalls of the structure. As shown, over fins 503, first spacer layer 514 may extend laterally in a direction outward from the gate structure to cover the exposed surfaces of fins 503. First spacer layer 514 may be or include a first material in embodiments, and may include a silicon-containing material or metal-containing material in embodiments. First spacer layer 514 may be an insulative material, and may include any of oxygen, nitrogen, and/or carbon in embodiments. Exemplary materials may be or include silicon oxide, silicon nitride, silicon oxycarbide, silicon oxynitride, silicon carbonitride, silicon oxycarbonitride, or may be a metal-containing material including any of the oxygen, nitrogen, and/or carbon concentrations including, and may include, for example, aluminum, magnesium, titanium, tantalum, or any other metal and transition metal species, as well as other metalloid materials. The deposition or formation may be performed in any of a variety of ways of performing a conformal coating on the exposed structures to a thickness of less than or about a few nanometers or more.

Figure 5C:
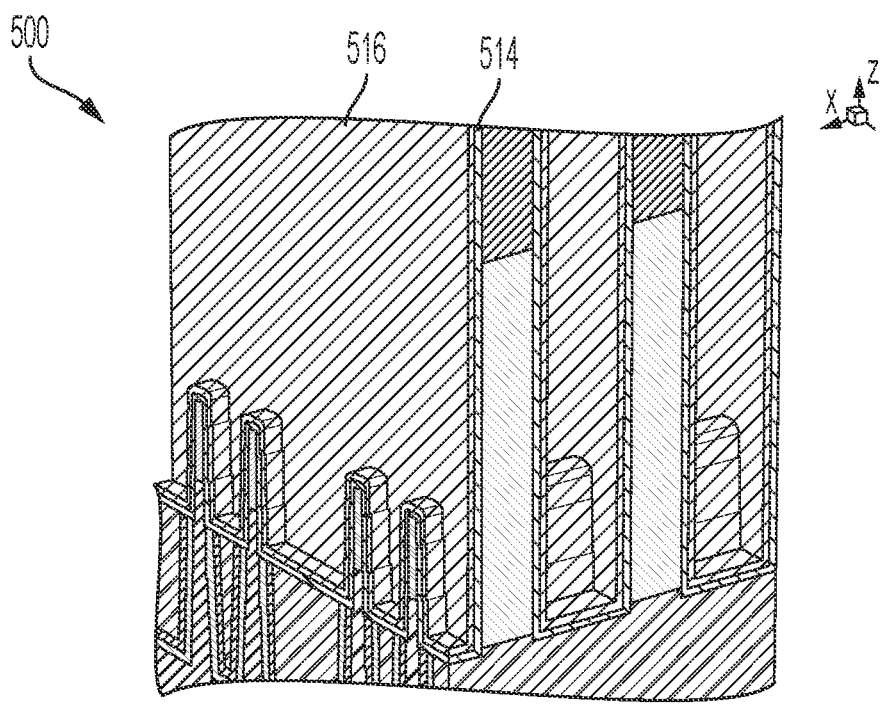

Subsequent formation of the first spacer layer 514, a second spacer layer 516 may be formed adjacent to and overlying the first spacer layer 514 at operation 410, as illustrated in FIG. 5C. Second spacer layer 516 may similarly be formed by a conformal coating operation over surfaces of the semiconductor structure. Second spacer layer 516 may be a sacrificial layer that may later be removed to produce an airgap within the semiconductor structure. As illustrated, second spacer layer 516 may not directly contact any of the gate structure 505, the fins 503, or the substrate 501. Because each of these features may be fully covered by first spacer layer 514, second spacer layer 516 may only contact first spacer layer 514 in some embodiments, although in other embodiments second spacer layer 516 may contact additional structures as well.

Second spacer layer 516 may be formed of a second material, which may be the same material or a different material of the first material from which first spacer layer 514 may be formed. Second spacer layer 516 may be formed from or include any of the previously noted materials, and may be characterized by a different anionic composition or concentration from first spacer layer 514. For example, second layer 516 may be characterized by an increased carbon, oxygen, or nitrogen concentration from first spacer layer 514. This adjustment may produce a characteristic by which selectivity of etching may be based. By adjusting the materials between first spacer layer 514 and second spacer layer 516, second spacer layer 516 may be removed selective to first spacer layer 514 at later operations of removal to produce an airgap adjacent first spacer layer 514.

Figure 5D:
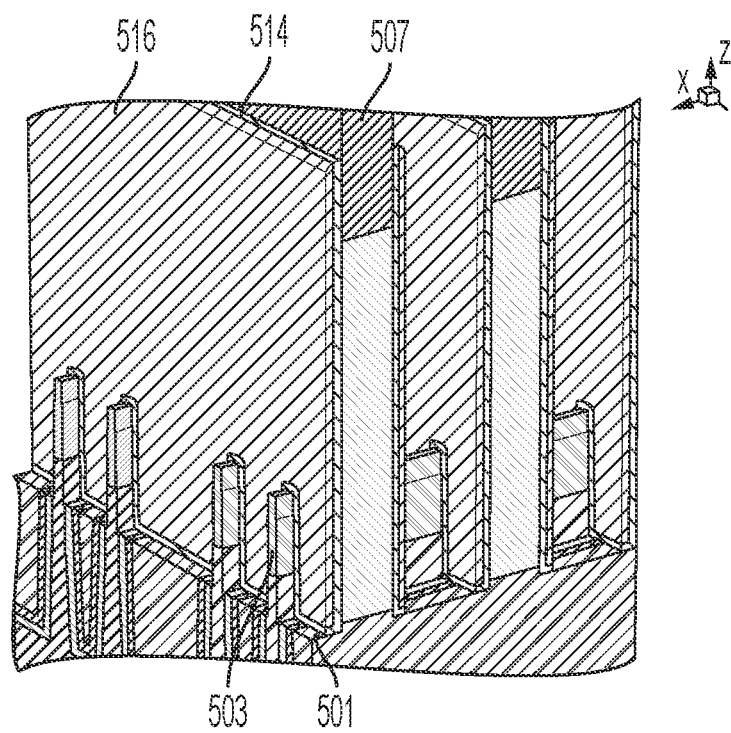

Subsequent formation of the second spacer layer, a removal operation may be performed at operation 415 to expose structures of the semiconductor structure, as illustrated in FIG. 5D. The recess performed at operation 415 may be performed anisotropically to expose lateral features while maintaining the first spacer layer 514 and the second spacer layer 516 overlying the sidewalls of the gate structure 505. When epitaxial growth is performed to form source/drain materials over the fins in later operations, as one exemplary formation method, the growth may occur on any exposed silicon containing materials, such as fins 503. As previously noted, gate structure 505 may include a dummy gate material such as polysilicon. If polysilicon is exposed during the source/drain formation, materials may also improperly form on the dummy gate. Accordingly, operation 415 may maintain complete coverage of the gate structure 505 dummy gate polysilicon or other dummy gate material.

As illustrated, the recess or etching performed may remove the first spacer layer 514 and the second spacer layer 516 from cap material 507, and may fully recess the materials from the fins 503 in a lateral direction from the gate structure 505 beyond a thickness of the formation of the first spacer layer 514 and the second spacer layer 516 along the sidewalls of the gate structure 505. For example, each of first spacer layer 514 and second spacer layer 516 may be from about 1 nm to about 3 nm, and thus the two spacer layers may extend laterally from gate structure 505 from about 2 nm to about 6 nm. This lateral coverage will partially cover fins 503, although laterally outward from this position, the fins 503 may be fully recessed to the substrate level as illustrated in the figure. Additionally, substrate 501 may be exposed in regions about the gate structures 505 as well.

As can be seen in the figure, after the recess, second spacer layer 516 may be characterized by little to no lateral extension from a thickness along the sidewalls of the gate structure, and may be characterized by a sheet-like profile or planar shape. First spacer layer 514, however, may include an amount of lateral extension under the entire thickness of second spacer layer 516 as illustrated. First spacer layer 514 may be characterized by a lateral extension in a direction outward from the gate structure. This lateral extension may be equivalent or identical to a thickness of the second spacer layer 516. Consequently, second spacer layer 516 may not be in contact with any other structures of the semiconductor device but for first spacer layer 514 in some embodiments. Accordingly, removal of second spacer layer 516 may not expose any other materials in the structure.

The removal operation 415 may be performed in chamber 200 previously described, which may allow an oxide-selective etch to be performed or an etch selective towards cabon-containing films, for example, which may remove the first spacer layer 514 and the second spacer layer 516, without impacting, or with a minimal impact on any of the other materials on the substrate. The process may be performed using a dry etch process utilizing a plasma or remote plasma, which may produce plasma effluents of a halogen-containing precursor, such as, for example, a fluorine-containing precursor, or a chlorine-containing precursor. The process may also utilize a hydrogen-containing precursor in embodiments, which may also be included in the remote plasma or may bypass the remote plasma to interact with radical halogen-containing plasma effluents in the processing region.

The process may be performed below about 10 Torr in embodiments, and may be performed below or about 5 Torr in embodiments. The process may also be performed at a temperature below about 100° C. in embodiments, and may be performed below about 50° C. As performed in chamber 200, or a variation on this chamber, or in a different chamber capable of performing similar operations, the process may anisotropically remove first spacer layer 514 and second spacer layer 516 selective to cap layer 507, fins 503, and substrate 501. In embodiments, the process may have a selectivity relative to first spacer layer 514 and second spacer layer 516 greater than or about 100:1, and may have a selectivity greater than or about 200:1, greater than or about 300:1, greater than or about 400:1, or greater than or about 500:1 in embodiments. Because of this selectivity, and because the formed material may be only a few nanometers in thickness as previously noted, all other exposed materials may be substantially or essentially maintained during this removal operation.

Some conventional processes may form source/drain materials overlying fins after an etch process in which fins are exposed after a sacrificial layer is formed, although conventional techniques may not be performed similar to the operations of method 400 previously described. This formation will produce source/drain materials that directly abut, or are adjacent to the sacrificial layer. Accordingly, during removal of the sacrificial layers, the source/drain materials will be directly exposed to etchant materials, which will at least partially etch or affect the source/drain materials in contact with the outer surface of the sacrificial layer. Although an airgap may be formed, these processes will detrimentally affect device performance by degrading the source/drain materials during the etch processes to form the airgap. The present technology may overcome these issues by producing an additional spacer layer outward from the second spacer layer 516.

Figure 5E:
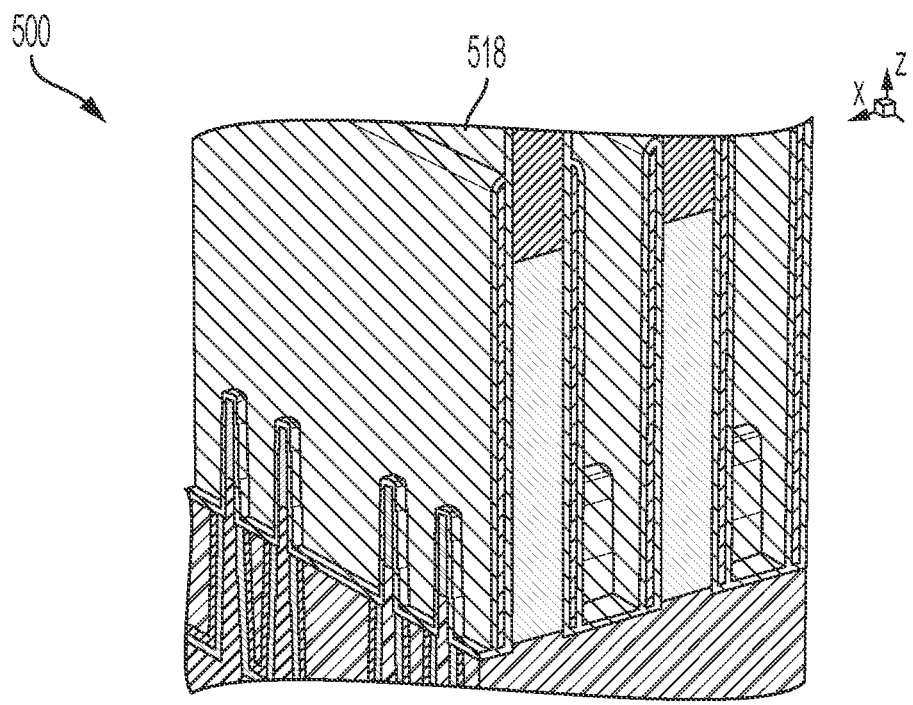

In some embodiments method 400 may optionally include forming a third spacer layer 518 at operation 420, as illustrated in FIG. 5E. Third spacer layer 518 may be formed similarly to first spacer layer 514 and/or second spacer layer 516, and may conformally cover exposed regions of cap layer 507, fins 503 and substrate 501 that may have been exposed during the recessing operation 415. Third spacer layer 518 may be directly adjacent second spacer layer 516, and may be in direct contact with at least a portion of first spacer layer 514. As previously noted, first spacer layer 514 may extend laterally along the substrate and fins a first distance, such as the thickness of the second spacer layer 516. During the formation of third spacer layer 518, the third spacer layer material may directly contact first spacer layer 514 along an outermost surface of the laterally extending portion of first spacer layer 514 along surfaces of the fins 503 and substrate 501 at the first distance of lateral extension.

Third spacer layer 518 may be any of the materials previously described, and in some embodiments, third spacer layer 518 may be the same material as first spacer layer 514. Accordingly, the spacer formed may provide sidewalls of a first material fully enclosing second spacer layer 516 on both sidewall surfaces as well as along a bottom surface. Thus, any subsequently formed materials that are formed laterally outward from the gate structure and the spacer structure including each of first spacer layer 514, second spacer layer 516, and third spacer layer 518, may not contact any lateral portion or surface of second spacer layer 516, as third spacer layer 518 may be directly adjacent second spacer layer 516 along an outer sidewall in an outward lateral direction from the gate structure 505.

Figure 5F:
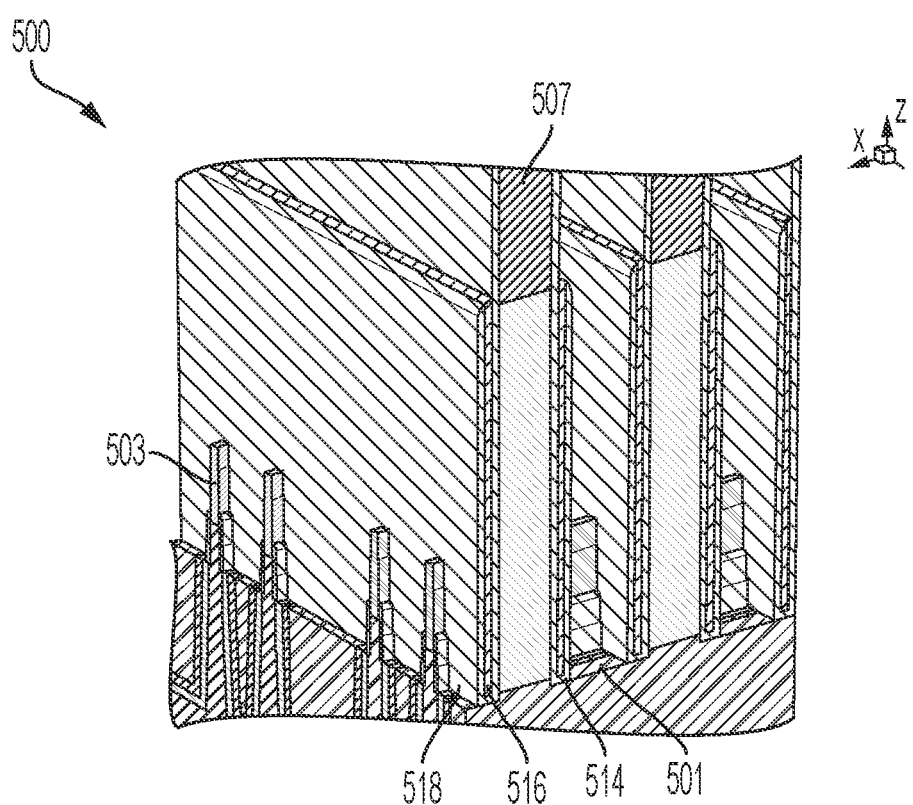

Subsequent formation of the third spacer layer, method 400 may optionally include a partial recessing of third spacer layer 518 at operation 425, as illustrated in FIG. 5F. The recess operation may partially expose vertical portions of the fins laterally outward of the third spacer layer 518. Similar to first spacer layer 514 and second spacer layer 516, third spacer layer 518 may be characterized by a lateral thickness, and may overly fins 503 and substrate 501 at least to this thickness. The recess may also maintain an amount of third spacer material 518 along portions of fins 503 proximate or adjacent substrate 501. The recessing operation may be similar to the previous recessing operation and may be similarly selective to the cap layer 507, fins 503, and substrate 501.

Subsequent formation and recess of the third spacer layer 518, fabrication may continue and may form or grow source/drain materials overlying the partially exposed regions of the fins 503 at optional operation 430. The source/drain materials may be similar materials as the fins on which the source/drain materials are grown, and may be formed in the same direction as the fins to be normal to the gate structure. As previously explained, the source/drain material may be laterally offset from the second spacer layer 516 at least by the third spacer layer 518 or other intervening layers, and may not contact second spacer layer 516 at any position on the semiconductor structure. Source/drain materials may be epitaxially grown overlying the fins, or may be performed in any other way to provide, silicon, silicon germanium, or other source/drain materials on the structure. Processing may then continue in any number of operations to produce a metal gate structure after removing the dummy gate. The processing may be performed in any number of ways including in any known or to be developed way.

Figure 5G:
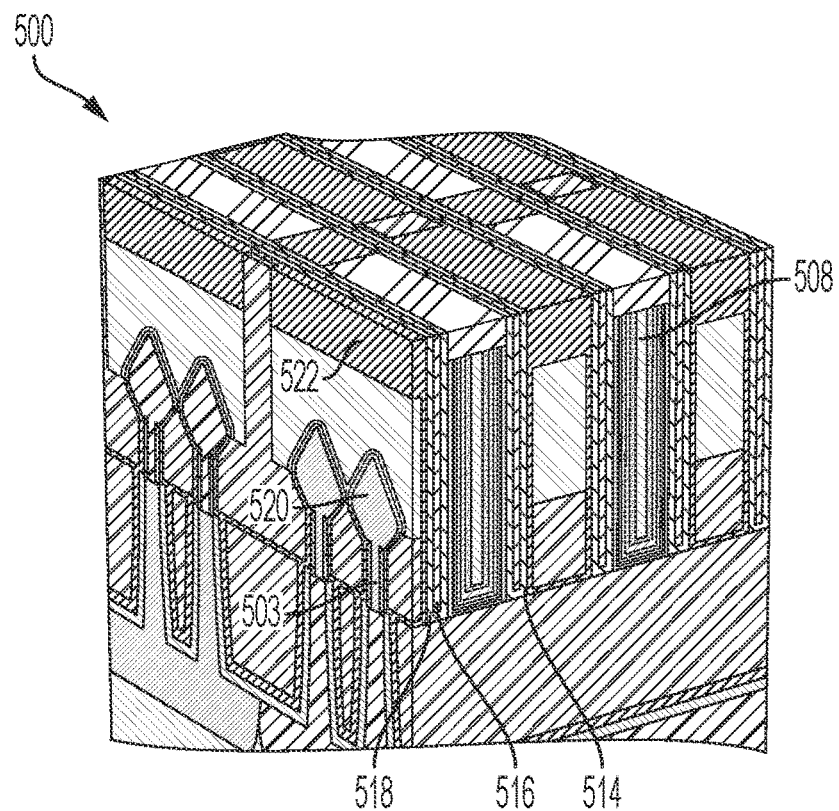

After a variety of subsequent processing, which may include exposing upper surfaces of the layers of the spacer structure, the semiconductor structure may, in some embodiments resemble the structure illustrated in FIG. 5G. As shown, a metal gate 508 may have replaced dummy gate structure 505, and source/drain materials 520 have been formed about the upper portions of fins 503 that were exposed as previously described. Additionally, a spacer structure has been formed adjacent metal gate 508 that includes first spacer layer 514, second spacer layer 516, and third spacer layer 518. As illustrated and discussed previously, first spacer layer 514 extends laterally beneath second spacer layer 516 to contact third spacer layer 518. Consequently, second spacer layer 516 may not be exposed to any other materials on the structure except for first spacer layer 514 and third spacer layer 518.

Figure 5H:
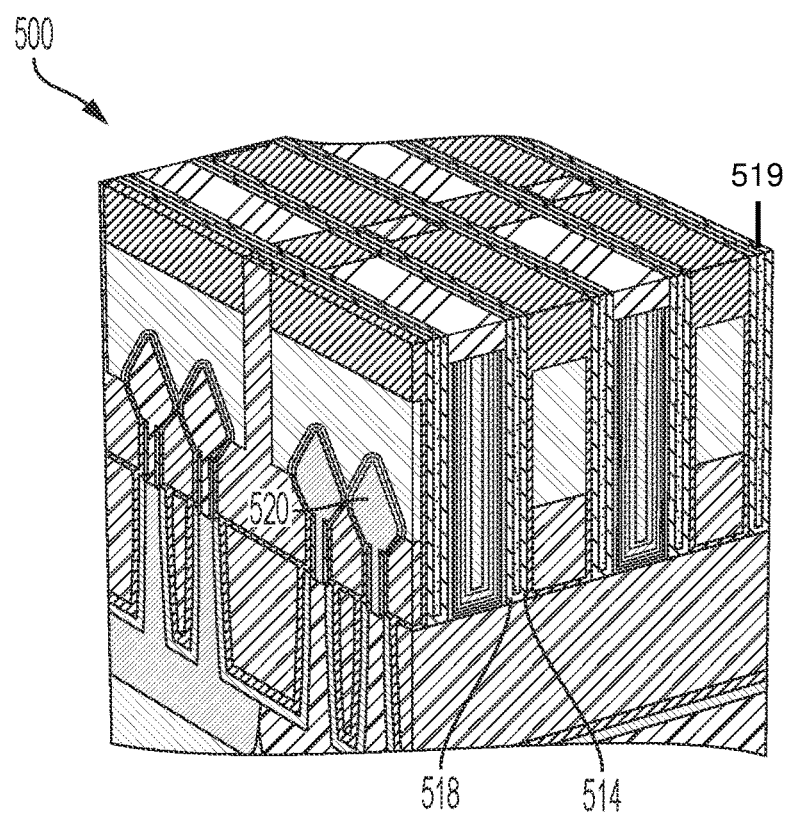

Second spacer layer 516 may then be etched at operation 435 from the spacer structure to form an airgap 519 between first spacer layer 514 and third spacer layer 518, as illustrated in FIG. 5H. A selective etch process may be performed as described previously, but may be tuned to provide selectivity between the second spacer layer and the first spacer layer and third spacer layer to allow complete removal of the second spacer layer 516. As described above, because of the inclusion of the third spacer layer 518 and the particular process of forming the second spacer layer 516, source/drain materials 520 may not be exposed to any etchant during the removal process. Thus, etchants or precursors may be used that have imperfect selectivity to the source/drain materials, or may be non-selective to the source/drain materials as there may be no exposure.

As shown, the airgap may be protected from any direct contact to the source/drain materials, and after removal of sacrificial second spacer layer 516, may be defined on either side surface by first spacer material 514 and third spacer material 518, and may be defined from below by first spacer material 514. Semiconductor structure 500 may also include a contact etch stop layer 522, which may be any of the materials previously described, such as silicon nitride, for example, and may provide a fourth spacer layer in embodiments that is positioned laterally outward of the spacer structure in a direction from the gate structure. However, based on the formation process in which a contact etch stop layer may be formed subsequent growth of the source/drain materials, without formation of the third spacer layer 518, contact etch stop layer 522 would not constitute an intervening layer, and the source/drain materials would still directly contact the sacrificial second spacer layer 516. Consequently, during formation of the airgap, the source/drain materials would be contacted by the etchants, and damage due to imperfect selectivity may occur. By forming spacer structures according to embodiments of the present technology, airgap structures may be formed that may not detrimentally affect source/drain materials, and may therefore improve performance by producing a spacer characterized by a reduced dielectric constant that may reduce parasitic capacitance in produced devices.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a layer" includes a plurality of such layers, and reference to "the precursor" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor structure comprising:
    a substrate;
    a gate structure overlying the substrate and formed in a first direction across the substrate;
    a fin overlying the substrate and formed in a second direction across the substrate, wherein the second direction is normal to the first direction, and wherein the fin intersects the gate structure;
    a spacer structure adjacent the gate structure, wherein the spacer structure comprises:
        a first layer adjacent the gate structure and extending a first distance laterally outward from the gate structure over the fin and the substrate; and
        a second layer laterally outward from the first layer and contacting the first layer at the first distance, wherein an airgap is at least partially defined between a portion of the first layer adjacent the gate, a portion of the first layer overlying the substrate, and the second layer; and
    a source/drain material formed about the fin external to the spacer structure, wherein at least one intervening layer of the spacer structure is included between the source/drain material and the airgap.

2. The semiconductor structure of claim 1, wherein the first layer and second layer comprise one or more materials selected from the group consisting of silicon nitride, silicon carbonitride, silicon oxycarbide, silicon oxycarbonitride, silicon oxide, a metal oxide, and a metal nitride.

3. The semiconductor structure of claim 1, further comprising a contact etch stop layer positioned laterally outward of the spacer structure in a direction from the gate structure.

\* \* \* \* \*